US012156443B2

(12) United States Patent
Wei et al.

(10) Patent No.: US 12,156,443 B2
(45) Date of Patent: Nov. 26, 2024

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Feng Wei, Beijing (CN); Lili Du, Beijing (CN); Hongjun Zhou, Beijing (CN); Jianchang Cai, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 638 days.

(21) Appl. No.: 17/296,592

(22) PCT Filed: Aug. 7, 2020

(86) PCT No.: PCT/CN2020/107711
§ 371 (c)(1),
(2) Date: May 25, 2021

(87) PCT Pub. No.: WO2022/027556
PCT Pub. Date: Feb. 10, 2022

(65) Prior Publication Data
US 2023/0148233 A1    May 11, 2023

(51) Int. Cl.
*H10K 59/131*    (2023.01)
*G09G 3/00*    (2006.01)
(Continued)

(52) U.S. Cl.
CPC .......... *H10K 59/131* (2023.02); *G09G 3/006* (2013.01); *G09G 3/3266* (2013.01); *H10K 59/88* (2023.02);
(Continued)

(58) Field of Classification Search
CPC ...... H10K 59/131; H10K 59/88; H10K 59/40; H10K 59/122; H10K 50/8426;
(Continued)

(56) References Cited

U.S. PATENT DOCUMENTS 9,978,314 B2 * 5/2018 Bae ...................... G09G 3/2085
2003/0151587 A1 * 8/2003 Yamashita ............. G09G 3/006
345/102
(Continued)

FOREIGN PATENT DOCUMENTS

CN    101118329 A    2/2008
CN    101364604 A    2/2009
(Continued)

OTHER PUBLICATIONS

WIPO, International Search Report, PCT/CN2021/101198 issued Sep. 24, 2021.
(Continued)

*Primary Examiner* — Mouloucoulaye Inoussa
(74) *Attorney, Agent, or Firm* — HOUTTEMAN LAW LLC

(57) ABSTRACT

A display substrate includes: a base substrate having a display region and a peripheral region surrounding the display region; a plurality of sub-pixels in the display region; a plurality of data lines in the display region, electrically coupled to the plurality of sub-pixels respectively, and configured to provide a data signal to the plurality of sub-pixels respectively; a plurality of pads in the peripheral region, wherein at least a portion of the plurality of pads are configured to provide a data signal to the plurality of data lines respectively; at least one test data signal line in the peripheral region; at least one test control signal line in the
(Continued)

peripheral region; and a plurality of test units in the peripheral region and on a side of the plurality of pads away from the display region.

19 Claims, 11 Drawing Sheets

(51) Int. Cl.
  *G09G 3/3225* (2016.01)
  *G09G 3/3266* (2016.01)
  *H10K 59/88* (2023.01)
(52) U.S. Cl.
  CPC ... *G09G 3/3225* (2013.01); *G09G 2300/0408* (2013.01); *G09G 2300/0842* (2013.01); *G09G 2300/0861* (2013.01); *G09G 2310/0281* (2013.01); *G09G 2330/04* (2013.01); *G09G 2330/12* (2013.01)
(58) Field of Classification Search
  CPC .. H10K 59/126; H10K 50/824; H10K 59/124; H10K 59/87; H10K 50/84; H10K 50/822; H01L 27/12; H01L 27/0292; H01L 27/124; H01L 27/1255; G09G 3/3266; G09G 3/006; G09G 3/3233; G09G 3/3225; G09G 3/20; G09G 3/2092; G09G 3/3275; G09G 3/3688; G09G 2310/0297; G09G 2300/0426; G09G 2300/0842; G09G 2330/12; G09G 2300/0861; G09G 2300/0408; G09G 2330/04; G09G 2310/0286; G09G 2310/0281; G09G 2310/0251; G09G 2300/08; G09G 2380/02; G09G 2300/0819; G09G 2310/0272; G09G 2300/0443; G09G 2310/0262; G09G 2310/0275; G09G 2310/0267; G09G 2310/0278; G09G 2320/0242; G09G 2320/0295; G09G 2320/0209; G02F 1/1336; G02F 1/13452; G02F 1/136204; G02F 1/133345; G02F 1/1309; G02F 1/13458; H04N 17/00; G02B 27/01; G06F 3/0412; G06F 3/04164; G06F 3/044; G06F 3/0445; G06F 2203/04107; A61B 5/1172; A61B 5/0059; A61B 2562/0214; A61B 2562/222; A61B 2562/0247; A61B 2562/046; A61B 2562/0233; A61B 2562/0271; G06V 40/1318; G06V 40/1306; H05K 9/0067

USPC .............. 345/98, 214, 76, 690, 83, 92
See application file for complete search history.

(56) References Cited

U.S. PATENT DOCUMENTS

| | | | |
|---|---|---|---|
| 2007/0120790 A1* | 5/2007 | Jeon | G09G 3/006 345/87 |
| 2011/0018571 A1* | 1/2011 | Kim | G02F 1/1345 324/760.02 |
| 2014/0191930 A1* | 7/2014 | Okumoto | G09G 3/006 345/55 |
| 2014/0240521 A1* | 8/2014 | Kwak | G09G 3/006 348/189 |
| 2016/0043010 A1* | 2/2016 | Kwak | H01L 22/32 438/15 |
| 2016/0054636 A1* | 2/2016 | Chiang | G02F 1/167 257/774 |
| 2016/0260367 A1* | 9/2016 | Kwak | G09G 3/3291 |
| 2016/0351093 A1* | 12/2016 | Kim | G09G 3/2092 |
| 2017/0337859 A1* | 11/2017 | Hirata | G09G 3/006 |
| 2018/0033354 A1* | 2/2018 | Lee | G09G 3/006 |
| 2018/0182274 A1* | 6/2018 | Jung | G09G 3/006 |
| 2019/0066595 A1* | 2/2019 | Kim | G09G 3/3258 |
| 2019/0140036 A1* | 5/2019 | Hyeon | H10K 77/111 |
| 2020/0090566 A1* | 3/2020 | Lee | G09G 3/035 |
| 2021/0097928 A1* | 4/2021 | Yoon | H05K 9/0067 |
| 2021/0209979 A1* | 7/2021 | Gao | G09G 3/006 |
| 2021/0247634 A1* | 8/2021 | Chen | H01L 22/32 |
| 2021/0326000 A1* | 10/2021 | Yang | G06F 3/0488 |
| 2022/0076599 A1* | 3/2022 | Akyol | G09G 3/3233 |
| 2022/0077273 A1* | 3/2022 | Qing | H01L 27/0248 |
| 2022/0189377 A1* | 6/2022 | Wang | G09G 3/3266 |
| 2022/0328574 A1* | 10/2022 | Jiang | H01L 27/0292 |

FOREIGN PATENT DOCUMENTS

| | | |
|---|---|---|
| CN | 101847638 A | 9/2010 |
| CN | 103530679 A | 1/2014 |
| CN | 204516283 U | 7/2015 |
| CN | 108803111 A | 11/2018 |
| CN | 109407321 A | 3/2019 |
| CN | 109491154 A | 3/2019 |
| CN | 109637352 A | 4/2019 |
| CN | 111292660 A | 6/2020 |
| CN | 111430572 A | 7/2020 |

OTHER PUBLICATIONS

USPTO, U.S. Appl. No. 17/778,504, First Office Action issued Mar. 30, 2023.

* cited by examiner

DISPLAY SUBSTRATE AND DISPLAY DEVICE

TECHNICAL FIELD

The present disclosure relates to the field of display technologies, and in particular, to a display substrate and a display device.

BACKGROUND

In order to simplify structures of a driver chip, a detection device, and the like, a part of a driver unit or a driver circuit for display may be directly provided on a display substrate.

SUMMARY

As a first aspect, an embodiment of the present disclosure provides a display substrate. The display substrate includes: a base substrate having a display region and a peripheral region surrounding the display region; a plurality of sub-pixels in the display region; a plurality of data lines in the display region, electrically coupled to the plurality of sub-pixels respectively, and configured to provide a data signal to the plurality of sub-pixels respectively; a plurality of pads in the peripheral region, wherein at least a portion of the plurality of pads are configured to provide a data signal to the plurality of data lines respectively; at least one test data signal line in the peripheral region; at least one test control signal line in the peripheral region; and a plurality of test units in the peripheral region and on a side of the plurality of pads away from the display region. At least one of the plurality of test units is electrically coupled to the at least one test data signal line, the at least one test control signal line and at least one data line of the plurality of data lines respectively, and configured to transmit a signal provided by the at least one test data signal line to the at least one data line according to a signal provided by the at least one test control signal line.

In some embodiments, the display region includes: a first boundary and a second boundary extending substantially along a first direction; a third boundary and a fourth boundary extending substantially along a second direction, the first boundary and the second boundary being on opposite sides of the display region respectively, and the third boundary and the fourth boundary being on opposite sides of the display region respectively; a first arc angle connecting the first boundary and the third boundary; a second arc angle connecting the first boundary and the fourth boundary; a third arc angle connecting the second boundary and the third boundary; and a fourth arc angle connecting the second boundary and the fourth boundary, The first direction and the second direction intersect each other.

The peripheral region includes a first edge region outside the first boundary, a second edge region outside the second boundary, a third edge region outside the third boundary, a fourth edge region outside the fourth boundary, a first corner region connecting the first edge region and the third edge region, a second corner region connecting the first edge region and the fourth edge region, a third corner region connecting the second edge region and the third edge region, and a fourth corner region connecting the second edge region and the fourth edge region.

In some embodiments, the first boundary and the second boundary are parallel to the first direction, and the third boundary and the fourth boundary are parallel to the second direction.

In some embodiments, the first direction is perpendicular to the second direction, and each of the first arc angle, the second arc angle, the third arc angle, and the fourth arc angle is a convex arc angle.

In some embodiments, at least a portion of the plurality of test units is in the second edge region.

In some embodiments, all of the plurality of test units are in the second edge region.

In some embodiments, the display substrate further includes a plurality of multiplexing units, a plurality of multiplexing data signal lines, a plurality of multiplexing control signal lines in the peripheral region.

At least a portion of the plurality of multiplexing units is in the first edge region.

The plurality of pads are on a side of the at least a portion of the plurality of multiplexing units away from the display region.

At least one multiplexing unit of the plurality of multiplexing units is electrically coupled to one of the plurality of multiplexing data signal lines, at least two of the plurality of multiplexing control signal lines, and at least two of the plurality of data lines respectively, and is configured to supply a signal supplied from the one multiplexing data signal line to the at least two data lines in a time-division manner according to signals supplied from the at least two multiplexing control signal lines.

In some embodiments, at least two of the plurality of multiplexing units are electrically coupled to a same multiplexing data signal line via different sub-lines.

In some embodiments, the plurality of multiplexing control signal lines are between the at least one test data signal line and the display region, and the plurality of multiplexing control signal lines are between the at least one test control signal line and the display region.

In some embodiments, all of the plurality of multiplexing units are in the first edge region.

In some embodiments, each of the plurality of multiplexing data signal lines is electrically coupled to at least one of the plurality of pads, and each of the plurality of multiplexing control signal lines is electrically coupled to at least one of the plurality of pads.

In some embodiments, the display substrate further includes a plurality of pins in the peripheral region.

The plurality of pins are on a side of the plurality of multiplexing units away from the display region.

At least a portion of the plurality of pins is on a side of the plurality of pads along the first direction.

Each of the at least one test data signal line is electrically coupled to at least one of the plurality of pins.

Each of the at least one test control signal line is electrically coupled to at least one of the plurality of pins.

In some embodiments, the plurality of pins are respectively on two sides of the plurality of pads along the first direction.

In some embodiments, the display substrate further includes a plurality of first signal introduction lines in the peripheral region. The plurality of first signal introduction lines are electrically coupled to at least a portion of the plurality of pads, at least one of the plurality of multiplexing control signal lines, the at least one test data signal line, and the at least one test control signal line, respectively.

In some embodiments, the display substrate further includes a plurality of second signal introduction lines. The plurality of second signal introduction lines are electrically coupled to at least one of the plurality of pins and at least one of the plurality of first signal introduction lines, respectively.

In some embodiments, at least one of the plurality of multiplexing units comprises m multiplexing transistors.

Among the m multiplexing transistors of the at least one of the plurality of multiplexing units, a gate electrode of each of the m multiplexing transistors is electrically coupled to a respective one of the plurality of multiplexing control signal lines, a first electrode of each of the m multiplexing transistors is electrically coupled to a respective one of the plurality of data lines, and second electrodes of the m multiplexing transistors are electrically coupled to a same one of the plurality of multiplexing data signal lines.

In some embodiments, the plurality of multiplexing units are arranged in a row along the first direction.

The m multiplexing transistors of the at least one of the plurality of multiplexing units are arranged in a row along the first direction, and a first electrode and a second electrode of each of the m multiplexing transistors are respectively on two sides of an active layer of the multiplexing transistor along the first direction.

In some embodiments, the at least one test data signal line is in the peripheral region and is a closed line surrounding the display region, and the at least one test control signal line is in the peripheral region and is a closed line surrounding the display region.

In some embodiments, the at least one test data signal line includes n test data signal lines with n being an integer greater than or equal to 2, and the at least one test control signal line comprises one test control signal line.

At least one of the plurality of test units comprises n test transistors.

Among the n test transistors of a same test unit, gate electrodes of the n test transistors are electrically coupled to the one test control signal line, a first electrode of each of the n test transistors is electrically coupled to a respective one of the plurality of data lines, and a second electrode of each of the n test transistors is electrically coupled to a respective one of the n test data signal lines.

In some embodiments, the plurality of test units are arranged in a row along the first direction.

The n test transistors of the at least one of the plurality of test units are arranged in a row along a direction inclined with respect to both of the first direction and the second direction, the gate electrodes of the n test transistors are a one-piece structure in a stair shape, and a first electrode and a second electrode of each of the n test transistors are respectively on two sides of an active layer of the multiplexing transistor along the first direction.

As a second aspect, an embodiment of the present disclosure provides a display device including the display substrate describe above.

BRIEF DESCRIPTION OF THE DRAWINGS

The accompanying drawings, which provide a further understanding of the present disclosure and constitute a part of the specification, are used in conjunction with the following specific embodiments to explain the present disclosure, but are not intended to limit the present disclosure. The above and other features and advantages will become more apparent to those skilled in the art by describing exemplary embodiments in detail with reference to the accompanying drawings, in which.

DETAILED DESCRIPTION

Figure 1:
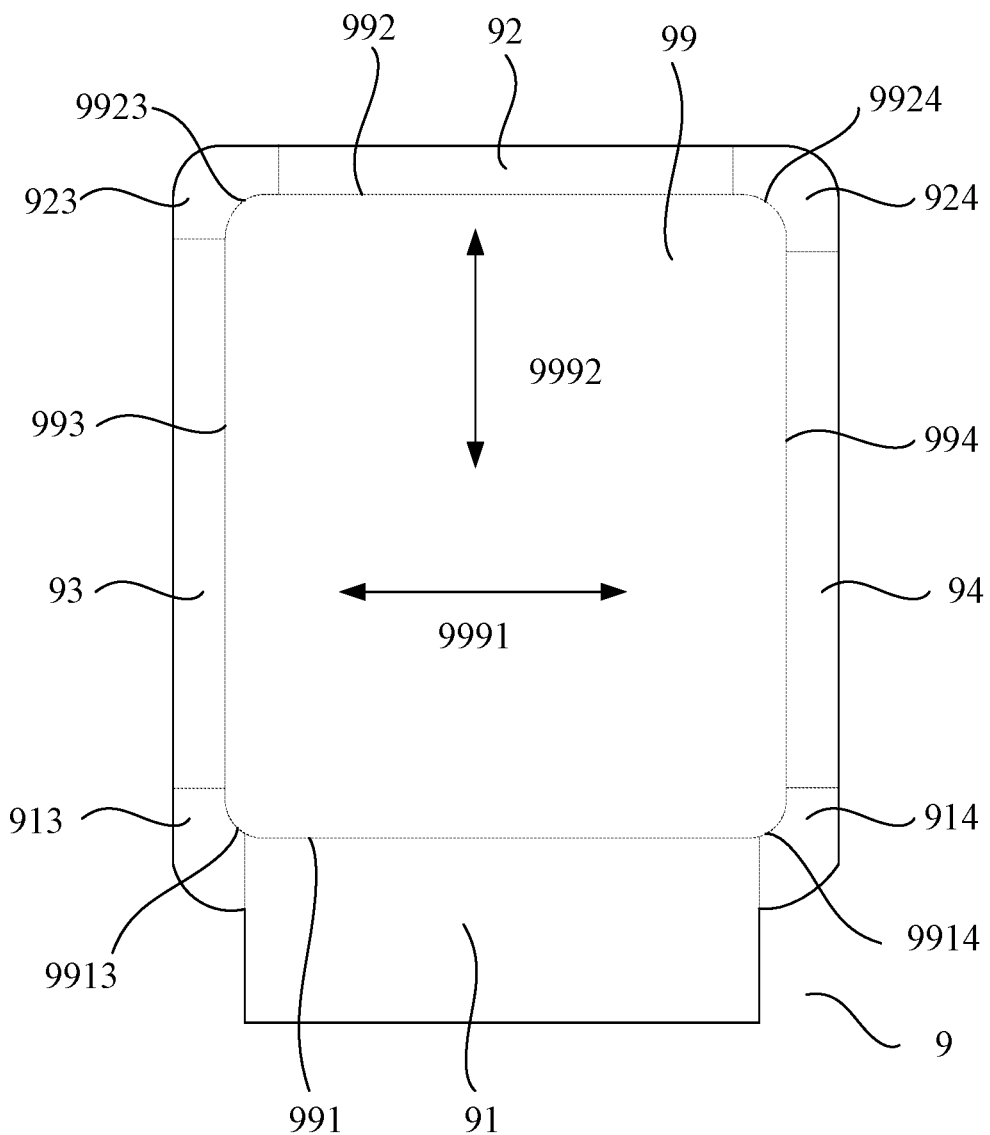
FIG. 1 is a schematic diagram showing a region division of a base substrate of a display substrate according to an embodiment of the present disclosure.

In order to make those skilled in the art better understand the technical solutions of the present disclosure, the display substrate and the display device provided by the embodiments of the present disclosure will be described in detail below with reference to the accompanying drawings.

Embodiments of the present disclosure will be described more fully hereinafter with reference to the accompanying drawings, and the embodiments illustrated may be embodied in different forms and should not be construed as limited to the embodiments set forth herein. Rather, these embodiments are provided so as to illustrate the present disclosure more thorough and complete, and enable those skilled in the art to fully convey the scope of the present disclosure.

The embodiments of the present disclosure will be described with reference to plan view and/or cross-sectional view by way of idealized schematic diagrams of the present disclosure. Accordingly, the example drawings may be modified in accordance with manufacturing techniques and/or manufacturing tolerances.

Embodiments of the present disclosure and features in the embodiments may be combined with each other without conflict.

The terminologies used in the present disclosure is for the purpose of describing particular embodiments only and is not intended to limit the present disclosure. As used in the present disclosure, the term "and/or" includes any and all combinations of one or more of associated listed items. As used in the present disclosure, the singular forms "a", "an" and "the" are intended to include the plural forms as well, unless the context clearly indicates otherwise. As used in the present disclosure, the terms "include", "comprise", and "made of" refer the presence of features, integers, steps, operations, elements, and/or components, but do not preclude the presence or addition of one or more of other features, integers, steps, operations, elements, components, and/or groups thereof.

Unless otherwise defined, all terms (including technical and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and cannot be interpreted in an idealized or overly formal sense unless expressly so defined herein.

The embodiments of the present disclosure are not limited to the embodiments shown in the drawings, and may include modifications of configurations formed based on a manufacturing process. Thus, regions shown in the drawings have schematic properties, and shapes of the regions shown in the drawings show specific shapes of regions of elements, but are not intended limit the present disclosure.

In some related arts, in order to simplify structures of a driver chip, a detection device, and the like, a part of a driver unit or a driver circuit for display may be directly provided on a display substrate.

In order to avoid affecting the display, the driver unit or the driver circuit are generally disposed in a peripheral region of the display substrate. However, the driver unit or the driver circuit occupies a larger area, thereby resulting in an excessively width of the peripheral region and accordingly an increased width of a bezel of the display device, which is not beneficial to realizing a narrow bezel design of the display device.

As a first aspect, referring to FIG. 1 to FIG. 18, an embodiment of the present disclosure provides a display substrate.

Figure 4:
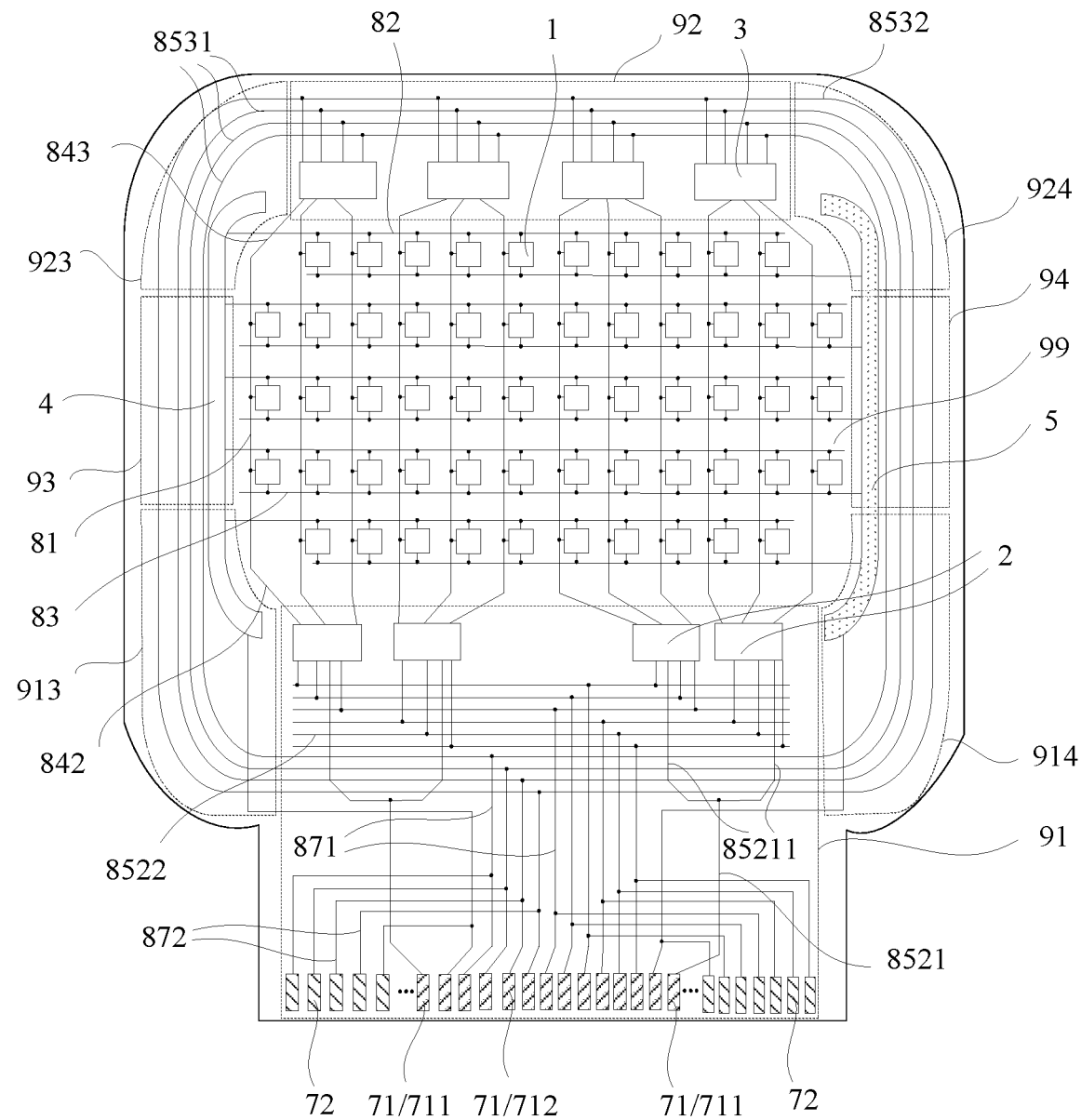
FIG. 4 is a schematic diagram showing a structure of a display substrate according to an embodiment of the present disclosure.

Referring to FIG. 1 and FIG. 4, the display substrate according to the embodiment of the present disclosure is a substrate for a display device (or a display panel).

The display substrate of the embodiment of the present disclosure includes: a base substrate 9 including a display region 99 and a peripheral region surrounding the display region 99; a plurality of sub-pixels 1 located in the display region 99; a plurality of data lines 81 located in the display region 99 and electrically coupled to the plurality of sub-pixels 1, wherein the plurality of data lines 81 are configured to supply a data signal to the plurality of sub-pixels 1 respectively; a plurality of pads 71 located in the peripheral region, wherein at least a portion of the plurality of pads 71 are configured to supply a data signal to the plurality of data lines 81 respectively; at least one test data signal line 8531 located in the peripheral region; at least one test control signal line 8532 located in the peripheral region; and a plurality of test units 3 located in the peripheral region, wherein the plurality of test units 3 are located on a side of the plurality of pads 71 away from the display region 99, at least one of the plurality of test units 3 is electrically coupled to the at least one test data signal line 8531, the at least one test control signal line 8532, and at least one of the plurality of data lines 81, respectively, and the at least one of the plurality of test units 3 is configured to transmit a signal provided by the at least one test data signal line 8531 to the at least one data line 81 according to a signal provided by the at least one test control signal line 8532.

Referring to FIG. 1 and FIG. 4, the base substrate 9 of the display substrate according to the embodiment of the present disclosure may be a flexible substrate or a rigid substrate. A center portion of the base substrate 9 is the display region 99 for display, and a periphery of the display region 99 is the peripheral region with other structures provided thereon.

"A structure is located in a region" means that an orthographic projection of the structure on the base substrate 9 is located within the region.

A plurality of sub-pixels 1 for display are disposed in the display region 99 of the base substrate 9. Each of the sub-pixels 1 is a smallest dot capable of independently emitting light of a desired brightness and color. In general, several sub-pixels 1 may constitute "one pixel" capable of emitting light of an arbitrary color and brightness, and each "pixel" is "one dot" in an image to be displayed.

Lead lines for supplying driving signals to the sub-pixels 1, such as data lines 81 for supplying data signals (i.e., data voltages) to the sub-pixels 1, are also provided in the display region 99.

Referring to FIG. 4, in some embodiments, other lead lines such as gate lines 82, control lines 83, and the like are further disposed in the display region 99.

Referring to FIG. 4, in some embodiments, the sub-pixels 1 in the display region 99 are arranged in an array, that is, the sub-pixels 1 are arranged in a plurality of rows and a plurality of columns. Each of the data lines 81 is parallel to a column direction, and each of the data lines 81 is electrically coupled to one column of sub-pixels 1. Each of the gate lines 82 is parallel to a row direction, and each gate line 82 is electrically coupled to one row of sub-pixels 1. Each of the control lines 83 is parallel to the row direction, and each of the control lines 83 is electrically coupled to one row of sub-pixels 1.

Therefore, when each of frames is displayed, a turn-on signal (i.e., a signal capable of turning on a transistor) is applied to each of the gate lines 82 in turn (in a time division manner). When each gate line 82 is applied with the turn-on signal, the data lines 81 write the data signals into sub-pixels 1 (e.g., a row of sub-pixels 1) electrically coupled to the gate line 82, respectively, so as to store the data signals in storage capacitors Cst, so that the sub-pixels 1 may display according to the stored data signals during the remaining time of the frame. The control line 83 may control a sub-pixel 1 to emit light or not.

"The row direction" and "the column direction" are two relative directions and may be perpendicular to each other. In some of the drawings, an example in which a horizontal direction is the row direction (i.e., a left-right direction) and a longitudinal direction is the column direction (i.e., an up-down direction) is illustrated. However, it should be understood that the horizontal direction and longitudinal direction are not limitation to "the row direction" and "the column direction", and "the row direction" and "the column direction" are not necessarily related to the placement position of the display substrate.

In the peripheral region of the base substrate 9, a plurality of test units (CT) 3 and a plurality of pads 71 are further provided. The plurality of test units 3 are located on a side of the plurality of pads 71 away from the display region 99, or the plurality of test units 3 and the plurality of pads 71 are respectively located on two opposite sides of the display region 99. That is, the plurality of test units 3 and the plurality of pads 71 are opposite to each other and spaced apart from each other by the display region 99.

Each of the test units 3 is electrically coupled to the test data signal line 8531 and the test control signal line 8532 respectively. Each of the test units 3 is configured to, under the control of the test control signal line 8532, provide (e.g., simultaneously or separately) a signal (i.e., a data signal) of the test data signal line 8531 to multiple data lines 81 electrically coupled to the test unit 3, so as to determine whether sub-pixels 1 electrically coupled to the multiple data lines 81 can emit light or whether there is a dead spot or a bright spot among the sub-pixels 1 electrically coupled to the multiple data lines 81.

The pads 71 are a structure configured to obtain a signal and are provided on the base substrate 9. Exemplarily, the pads 71 may be one or more metal layers in a sheet shape on the base substrate 9.

For example, the pads 71 may be a structure (e.g., a pin) for bonding with a flexible printed circuit (FPC) or a driver chip (IC), so as to obtain a signal from the flexible printed circuit or the driver chip.

Moreover, at least a portion of (or some of or a part of) the pads 71 is configured to provide a data signal to a data line 81. That is, the at least a portion of the pads 71 is configured to provide the data signal to the data line 81 during displaying, so as to control the sub-pixels 1 coupled to the data line 81 to display the required content.

In the embodiment of the present disclosure, the test units 3 are disposed on a side away from the pads 71, so that a layout area is fully and uniformly utilized, which is beneficial to narrowing the bezel of the display device, thereby realizing a narrow bezel design of the display device, and improving a screen-to-body ratio of the display device.

In some embodiments, each of the sub-pixels 1 has a pixel circuit provided therein and configured to enable the sub-pixel 1 to emit light.

Figure 2:
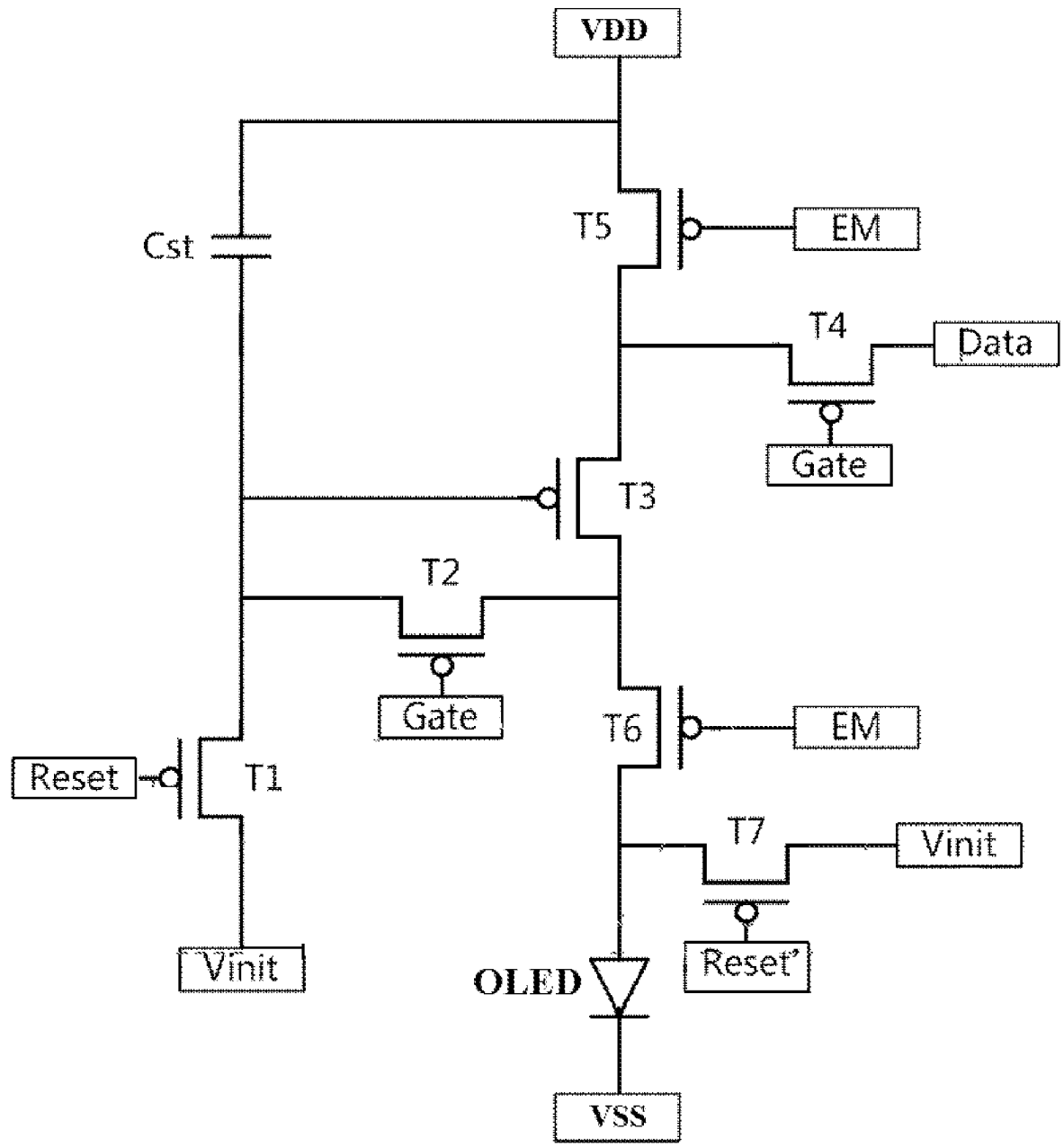
FIG. 2 is a schematic diagram showing a structure of a pixel circuit of a display substrate according to an embodiment of the present disclosure.

In an embodiment, referring to FIG. 2, a structure of the pixel circuit is a 7T1C structure. The 7T1C structure includes a first transistor T1, a second transistor T2, a driver transistor T3 (i.e., a third transistor), a fourth transistor T4, a fifth transistor T5, a sixth transistor T6, a seventh transistor T7, a storage capacitor Cst, an organic light-emitting diode OLED, a first reset terminal Reset, a second reset terminal Reset', an initialization terminal Vinit, a gate terminal Gate, a data terminal Data, a control terminal EM, a positive terminal VDD, a negative terminal VSS, and so on. The transistors may be P-type transistors (e.g., PMOSs) or N-type transistors (e.g., NMOSs).

In the above pixel circuit, when an appropriate data signal is written into a gate electrode (i.e., a first gate electrode 112) of the driver transistor T3, a current flowing through the driver transistor T3 may be controlled, so as to control the organic light-emitting diode OLED to emit light with a corresponding luminance, thereby realizing the display of the sub-pixel 1.

Figure 3:
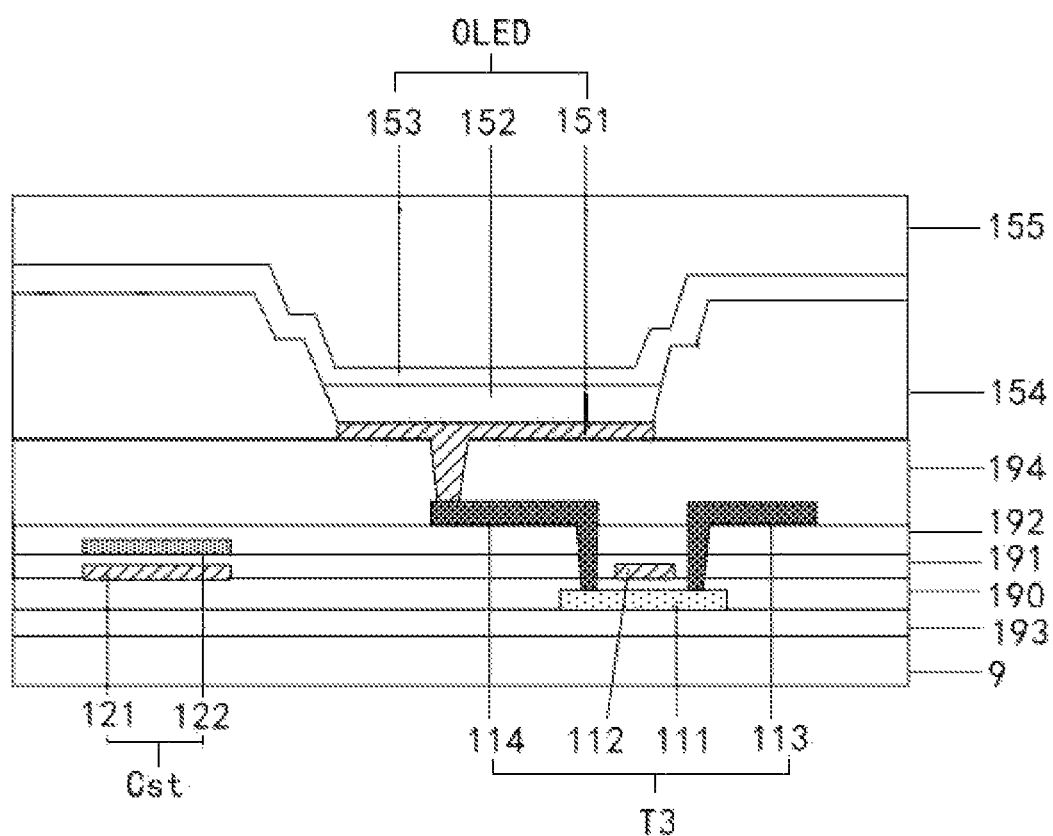
FIG. 3 is a schematic partial cross-sectional view showing a position where a driver transistor of a sub-pixel in a display substrate is located according to an embodiment of the present disclosure.

The positive terminal VDD is electrically coupled to a positive signal source (e.g., via a positive line), the negative terminal VSS is electrically coupled to a negative signal source (e.g., a cathode layer 153 of the organic light-emitting diode OLED shown in FIG. 3 is directly coupled to the negative signal source), the control terminal EM is coupled to the control line 83, the gate terminal Gate is coupled to the gate line 82, the data terminal Data is coupled to the data line 81, and other terminals are also electrically coupled to corresponding signal sources respectively.

Of course, the specific structures of the sub-pixel 1 and the pixel circuit are not limited to the above embodiment. Referring to FIG. 3, in some embodiments, each of the sub-pixels 1 includes a driver transistor T3 and a storage capacitor Cst. The driver transistor T3 includes: a first active layer 111 on a side of the base substrate 9; a gate insulation layer 190 on a side of the first active layer 11 away from the base substrate 9; a first gate electrode 112 on a side of the gate insulation layer 190 away from the base substrate 9; a first insulation layer 191 on a side of the first gate electrode 112 away from the base substrate 9; a second insulation layer 192 (i.e., an interlayer insulation layer ILD) on a side of the first insulation layer 191 away from the base substrate 9; and a first source electrode 113 and a first drain electrode 114 electrically coupled to the first active layer 111 and located on a side of the second insulation layer 192 away from the base substrate 9.

The storage capacitor Cst includes: a first electrode plate 121 on the same layer as the first gate electrode 112; and a second electrode plate 122 between the first insulation layer 191 and the second insulation layer 192.

When the pixel circuit of each of the sub-pixels 1 includes the driver transistor T3 and the storage capacitor Cst, the relationship of stacked layers of a partial structure of the sub-pixel 1 can be referred to FIG. 3.

Of course, other structures may be included in the sub-pixel 1.

For example, referring to FIG. 3, a buffer layer 193 for improving the contact performance between the first gate electrode 112 and the base substrate 9 may be disposed between the first gate electrode 112 and the base substrate 9. A planarization layer (PLN) 194 may be further disposed on a side of the first source electrode 113 and the first drain electrode 114 away from the base substrate 9. The organic light-emitting diode OLED may be further disposed on a side of the planarization layer 194 away from the base substrate 9. The organic light-emitting diode OLED may include an anode layer 151 coupled to the first drain electrode 114, and a light-emitting layer 152 and a cathode layer 153 disposed on a side of the anode layer 151 away from the substrate 99, such that the anode layer 151, the light-emitting layer 152, and the cathode layer 153 stacked on each other constitute the organic light-emitting diode OLED. The organic light-emitting diode OLED may be defined by a pixel defining layer 154 (PDL). An encapsulation layer 155 may be further disposed on a side of the cathode layer 153 away from the base substrate 9.

Of course, the structure of the above sub-pixel 1 may also be modified.

For example, the encapsulation layer 155 may be further include an organic encapsulation layer, an inorganic encapsulation layer, and the like, or may even include stacked layers of the organic encapsulation layer and the inorganic encapsulation layer. Other structures such as a reflective layer and a color filter film may be further disposed in the sub-pixel 1.

It should be understood that layers of other transistors of the sub-pixel 1 may be arranged in the same layer as corresponding layers of the driver transistor T3.

In the following description, layers where some other structures are located will be exemplarily described based on the stacked structure of the above sub-pixel.

Referring to FIG. 4, in some embodiments, at least one test data signal line 8531 is located in the peripheral region and is a closed line surrounding the display region 99.

At least one test control signal line 8532 is located in the peripheral region and is a closed line surrounding the display region 99.

Referring to FIG. 4, the test data signal line 8531 and the test control signal line 8532 surrounding the display region 99, e.g., three test data signal lines 8531 and one test control signal line 8532, may be disposed in the peripheral region. And, each of the test data signal line 8531 and the test control signal line 8532 forms a closed line, respectively.

It can be seen that, with above several lines surrounding the display region 99 (and located in the peripheral region), the driving of the test unit 3 can be realized, the product structure can be simplified, and the width of the bezel of the display device can be narrowed.

Referring to FIG. 1, in some embodiments, the display region 99 includes: a first boundary 991 and a second boundary 992 both extending substantially along a first direction 9991; a third boundary 993 and a fourth boundary 994 both extending substantially along a second direction 9992, the first boundary 991 and the second boundary 992 being located at opposite sides of the display region 99 respectively, the third boundary 993 and the fourth boundary 994 being located at opposite sides of the display region 99 respectively; a first arc angle 9913 connecting the first boundary 991 and the third boundary 993; a second arc angle 9914 connecting the first boundary 991 and the fourth boundary 994; a third arc angle 9923 connecting the second boundary 992 and the third boundary 993; and a fourth arc angle 9924 connecting the second boundary 992 and the fourth boundary 994.

The first direction 9991 intersects the second direction 9992.

The peripheral region includes: a first edge region 91 located outside the first boundary 991, a second edge region 92 located outside the second boundary 992, a third edge region 93 located outside the third boundary 993, a fourth edge region 94 located outside the fourth boundary 994, a first corner region 913 connecting the first edge region 91 and the third edge region 93, a second corner region 914 connecting the first edge region 91 and the fourth edge region 94, a third corner region 923 connecting the second edge region 92 and the third edge region 93, and a fourth corner region 924 connecting the second edge region 92 and the fourth edge region 94.

Referring to FIG. 1, in an embodiment of the present disclosure, the display region 99 may substantially have a shape of quadrangular. That is, the display region 99 has four boundaries each of which substantially extends along the first direction 9991 or the second direction 9992, and exemplarily, each of the boundaries may have a small arc line with a radian or a small fold line with a bend, and the like. The adjacent boundaries of the display region 99 are connected by the arc angle (i.e., the arc line). Accordingly, the peripheral region includes the four edge regions corresponding to the four boundaries of the display region 99 and the four corner regions corresponding to the four arc angles of the display region 99.

Referring to FIG. 1, in some embodiments, the first and second boundaries 991 and 992 are parallel to the first direction 9991.

The third and fourth boundaries 993 and 994 are parallel to the second direction 9992.

In some embodiments, the first direction 9991 is perpendicular to the second direction 9992.

Each of the first arc angle 9913, the second arc angle 9914, the third arc angle 9923, and the fourth arc angle 9924 is a convex arc angle.

Further, referring to FIG. 1, the opposite boundaries of the display region 99 may be straight lines parallel to each other, i.e., the display region 99 is in a shape of quadrangle with the arc angles.

Further, referring to FIG. 4, the adjacent boundaries of the display region 99 may be perpendicular to each other, and the arc angles of the display region 99 are the convex arc angles protruding outward from the display region 99, i.e., the display region 99 may be in shape of "a rectangular with the convex arc angles". Accordingly, in this case, the first direction 9991 may also be referred to as "a row direction (i.e., a horizontal direction in the drawings), and the second direction 9992 may also be referred to as "a column direction (i.e., a longitudinal direction in the drawings). That is to say, the data lines 81 may extend along the second direction 9992, and the gate lines 82 may extend along the first direction 9991.

Referring to FIG. 4, in some embodiments, at least a portion of the plurality of test units 3 is located in the second edge region 92.

Referring to FIG. 4, in an embodiment of the present disclosure, at least a part of/a portion of the test units 3 are disposed in the second edge region 92 (i.e., some test units 3 are disposed in the third corner region 923 and the fourth corner region 924).

As described above, most of the data lines 81 arranged along the first direction 9991 are located at positions corresponding to the second edge region 92 (i.e., an extension line of most of the data lines 81 along the second direction 9992 intersects with the second edge region 92), therefore it is convenient for the test units 3 located in the second edge region 92 to be electrically coupled to the corresponding data lines 81 nearby.

Referring to FIG. 4, in some embodiments, all of the test units 3 are located in the second edge region 92.

Referring to FIG. 4, all of the test units 3 may be located in the second edge region 92, thereby emptying the third corner region 923 and the fourth corner region 924 for disposing other structures therein.

Referring to FIG. 4, in some embodiments, the data lines 81 extend along the second direction 9992. A data line 81 at a position corresponding to the third or fourth corner regions 923, 924 along the first direction 9991 is electrically coupled to a corresponding test unit 3 via a test connection line 843.

Referring to FIG. 4, as described above, for the display region 99 having the arc angles, some data lines 81 have to correspond to the third corner region 923 or the fourth corner region 924 (i.e., an extension line of the some data lines 81 along the second direction 9992 intersects with the third corner region 923 or the fourth corner region 924). Since no test unit 3 is disposed in the third corner region 923 and the fourth corner region 924, the some data lines 81 need to be electrically coupled to the corresponding test units 3 in the second edge region 92 via the test connection lines 843 that are obliquely extending.

Of course, even in a case where a data line 81 corresponding to the second edge region 92 along the first direction 9991 is not directly aligned to a test unit 3 corresponding the data line 81, the data line 81 may be electrically coupled to the corresponding test unit 3 via the test connection line 843.

Referring to FIG. 4, in some embodiments, the display substrate of the embodiments of the present disclosure further includes a plurality of multiplexing units 2, a plurality of multiplexing data signal lines 8521, and a plurality of multiplexing control signal lines 8522, which are in the peripheral region.

At least a portion of the plurality of multiplexing units 2 is located in the first edge region 91.

The plurality of pads 71 are located on a side of the at least a portion of the plurality of multiplexing units 2 away from the display region 99.

At least one of the plurality of multiplexing units 2 is electrically coupled to one of the plurality of multiplexing data signal lines 8521, at least two of the plurality of multiplexing control signal lines 8522, and at least two of the plurality of data lines 81 respectively, and the at least one of the plurality of multiplexing units 2 is configured to time-divisionally supply a signal from the one of the plurality of multiplexing data signal lines 8521 to the at least two of the plurality of data lines 81 according to signals supplied from the at least two of the plurality of multiplexing control signal lines 8522.

Referring to FIG. 4, the plurality of multiplexing units 2 (MUX) are disposed at the opposite side to the test units 3. Each of the multiplexing units 2 is configured to time-divisionally supply a signal (i.e., a data signal) from one of the multiplexing data signal lines 8521 to multiple data lines 81 electrically coupled to the multiplexing unit 2, under the control of multiple multiplexing control signal lines 8522. That is, the multiplexing unit 2 may provide the data signal to the multiple data lines 81 by using one signal source (e.g., one pin of a driver chip) during the display process, thereby greatly reducing the number of actual signal sources and simplifying the structure of the product.

Moreover, the plurality of pads 71 and the plurality of multiplexing units 2 are located on the same side of the display region 99, and the plurality of pads 71 are farther from the display region 99 than the plurality of multiplexing units 2, so that it is beneficial to supplying signals to the multiplexing units 2 from the outside.

Referring to FIG. 4, at least a portion of the multiplexing units 2 is disposed in the first edge region 91 (although the multiplexing units 2 may also be disposed in the first corner region 913 and the second corner region 914).

As describe above, the plurality of data lines 81 may extend along the second direction 9992, most of the data lines 81 arranged along the first direction 9991 are located at positions corresponding to the first edge regions 91 (i.e., an extension line along the second direction 9992 of most of the data lines 81 intersects with the first edge regions 91), and the plurality of multiplexing unit 2 is located in the first edge area 91, so that the plurality of multiplexing unit 2 can be electrically coupled to corresponding data lines 81 nearby.

Referring to FIG. 4, in some embodiments, all of the plurality of multiplexing units 2 are located in the first edge region 91.

Referring to FIG. 4, all of the plurality of multiplexing units 2 may be located only in the first edge region 91, thereby emptying the third corner region 923 and the fourth corner region 924 for disposing other structures therein.

Referring to FIG. 4, in some embodiments, the data lines 81 extend along the second direction 9992; a data line 81 arranged along the first direction 9991 and located at a position corresponding to the first corner region 913 or the second corner region 914 is electrically coupled to a corresponding multiplexing unit 2 through a corresponding multiplexing connection line 842.

Referring to FIG. 4, as described above, for the display region 99 having the arc angles, some data lines 81 have to correspond to the first corner region 913 or the second corner region 914 (i.e., an extension line of the some data lines 81 along the second direction 9992 intersects with the first corner region 913 or the second corner region 914). Since no multiplexing unit 2 is disposed in the first corner region 913 and the second corner region 914, the some data lines 81 need to be electrically coupled to the corresponding multiplexing units 2 in the first edge region 91 via the multiplexing connection lines 842 that are obliquely extending.

Of course, even in a case where the data line 81 arranged along the first direction 9991 and corresponding to the first region 91 does not directly face to a multiplexing unit 3 corresponding to the data line 81, the data line 81 may be electrically coupled to the corresponding multiplexing unit 2 via the multiplexing connection line 843.

In the display substrate of the embodiment of the present disclosure, the multiplexing units 2 and the test units 3 are respectively located at two opposite sides of the display region 99, so that the various units can be uniformly distributed, which is beneficial to reducing the width of the peripheral region and realizing the narrow bezel design of the display device.

Referring to FIG. 4, in some embodiments, the display substrate of embodiments of the present disclosure further includes a plurality of gate lines 82 and a gate driver circuit 4.

The plurality of gate lines 82 are located in the display region 99 and extend along the first direction 9991. The plurality of gate lines 82 are electrically coupled to the plurality of sub-pixels 1 and configured to supply gate driving signals to the plurality of sub-pixels 1 respectively.

The gate driver circuit 4 is located in the third edge region 93, the first corner region 913, and the third corner region 923. The gate driver circuit 4 is electrically coupled to the plurality of gate lines 82, and is configured to supply the gate driving signals to the plurality of gate lines 82 respectively.

As described above, referring to FIG. 4, the display region 99 may further include the plurality of gate lines 82 each extending along the first direction 9991 (i.e., the row direction) and configure to supply the gate drive signals to the gate terminals Gate of the pixel circuits of the sub-pixels 1. The gate driving signals received by the gate lines 82 can be supplied by the gate driver circuit 4 disposed in the third edge region 93, the first corner region 913, and the third corner region 923. Since the gate driver circuit 4 is located in the third edge region 93, the first corner region 913, and the third corner region 923 (i.e., the gate driver circuit 4 occupies the peripheral region on the left side in the figure), the gate driver circuit 4 can be coupled to most of the plurality of gate lines 82 nearby the gate driver circuit 4.

Exemplarily, the gate driver circuit 4 may include a plurality of cascaded gate shift registers, and each of the gate shift registers is electrically coupled to one or more gate lines 82 to provide the gate driving signal to the corresponding gate line(s) 82. Moreover, an output terminal of each of the gate shift registers is also electrically coupled to a next gate shift register cascaded with the gate shift register so as to enable the corresponding gate shift register to operate.

The gate shift register can be embodied in various implementations, and will not be described in detail herein.

In terms of positon, each of the gate shift registers may be arranged substantially along the second direction 9992 in the first corner region 913, the third edge region 93, and the third corner region 923 in sequence.

Of course, when the gate line 82 is not aligned to a gate shift register corresponding to the gate line 82, the gate line 82 may also be electrically coupled to the gate shift register via a gate driving connection line.

Of course, the gate driver circuit 4 is required to be electrically coupled to some other signal sources to obtain the driving signal required for operation. For example, the gate driver circuit 4 may also be electrically coupled to a high-level signal source, a low-level signal source, one or more clock signal sources, etc.

Referring to FIG. 4, in some embodiments of the present disclosure, the display substrate further includes a plurality of control lines 83 and a control driving circuit 5.

The plurality of control lines 83 are located in the display region 99 and extend along the first direction 9991. The plurality of control lines 83 are electrically coupled to the plurality of sub-pixels 1 respectively, and configured to supply control driving signals to the plurality of sub-pixels 1 respectively.

The control driving circuit 5 is located in the fourth edge region 94, the second corner region 914 and the fourth corner region 924. The control driving circuit 5 is electrically coupled to the plurality of control lines 83, and is configured to supply the control driving signals to the plurality of control lines 83 respectively.

As described above, referring to FIG. 4, the display region 99 may further include the plurality of control lines 83 configured to supply the control driving signals to the gate terminals EM of the pixel circuits of the sub-pixels 1. The control driving signals received by the control lines 83 can be supplied by the control driving circuit 5 disposed in the fourth edge region 94, the second corner region 914 and the fourth corner region 924. Since the control driving circuit 5 is located in the fourth edge region 94, the second corner region 914 and the fourth corner region 924 (i.e., the control driving circuit occupies the peripheral region on the right side in the figure), the plurality of control lines 83 nearby the control driving circuit can be coupled to the control driving circuit.

Exemplarily, the control driving circuit 5 may include a plurality of cascaded control shift registers, and each of the control shift registers is electrically coupled to one or more control lines 83 to provide the control driving signal to the corresponding control line(s) 83. Moreover, an output terminal of each of the control shift register is also electrically coupled to a next control shift register cascaded with the control shift register so as to enable the corresponding control shift register to operate.

The control shift register can be embodied in various implementations, and will not be described in detail here.

In term of position, the control shift registers may be arranged substantially along the second direction 9992 in the second corner region 914, the fourth edge region 94, and the fourth corner region 924 in sequence.

Of course, when a control line 83 is not aligned with a control shift register corresponding to the control line 83, the control line 83 may also be electrically coupled to the control shift register via a control driving connection line.

Of course, the control driving circuit 5 is also required to be electrically coupled to some other signal sources to obtain the driving signal required by the operation. For example, the control driving circuit 5 may also be electrically coupled to a high-level signal source, a low-level signal source, one or more clock signal sources, etc.

As describe above, when the multiplexing unit 2 is disposed only in the first edge region 91 and the test unit 3 is disposed only in the second edge region 92, no multiplexing unit 2 and no test unit 3 is disposed in the third edge region 93, the fourth edge region 94, and the four corner regions. As such, the gate driver circuit 4 for driving the gate lines 82 and the control driving circuit 5 for driving the control lines 83 may be respectively disposed in the peripheral regions (i.e., in the third edge region 93, the first corner region 913, the third corner region 923, the fourth edge region 94, the second corner region 914, and the fourth corner region 924) at two opposite sides of the display region along the first direction 9991 so as to conveniently supply the signals to the corresponding gate lines 82 and the control lines 83.

As can be seen, according to above embodiments, the gate driver circuit 4 or the control driving circuit 5 in each of the corner regions may be coupled to the corresponding gate lines 82 and the corresponding control lines 83 nearby the gate driver circuit 4 or the control driving circuit 5. Moreover, in this case, each of the corner regions is only provided with one kind of circuit, therefore a phenomenon of mixed arrangement of various circuit structures (such as various units and shift registers) does not exist, thereby simplifying the layout design of the circuit, narrowing the width of the corner region, and realizing the narrow bezel design of the display device.

Of course, the circuit layout in the peripheral region on the opposite sides of the display region along the first direction 9991 is not limited thereto. For example, the gate driver circuits 4 may be disposed in the peripheral region on the opposite sides of the display region along the first direction 9991 so as to supply power from both ends of the gate lines 82 or to supply power to the gate lines 82 in different rows respectively, and so on. Alternatively, the control driving circuits 5 may be disposed in the peripheral region on the opposite sides of the display region along the first direction 9991 so as to supply power from both ends of the control lines 83 or to supply power to the control lines 83 in different rows, respectively, and so on.

Referring to FIG. 4, each of the multiplexing data signal lines 8521 is electrically coupled to at least one of the plurality of pads 71.

Each of the multiplexing control signal lines 8522 is electrically coupled to at least one of the plurality of pads 71.

That is to say, a multiplexing data signal line 8521 and a multiplexing control signal line 8522 both for controlling a same multiplexing unit 2 may be coupled to corresponding pads 71 to obtain desired signals from the corresponding pads 71.

In general, most of the various multiplexing units 2 are required to correspond to different multiplexing data signal lines 8521, while many (even all) of the test units 3 may correspond to the same test signal line and the same test control signal line 8532, therefore in general the number of the multiplexing data signal lines 8521 is much larger than the total number of test signal lines and test control signal lines 8532. Since the pads 71 and the multiplexing units 2 are disposed on the same side of the display region 99, the multiplexing units 2 may be coupled to the nearby pads 71 via lead lines, thereby decreasing the total length and the occupied area of the lead lines, narrowing the bezel of the display device, and simplifying the product structure.

Referring to FIG. 4, in some embodiments of the present disclosure, the display substrate further includes a plurality of pins 72 located in the peripheral region.

The plurality of pins 72 are located on a side of the plurality of multiplexing units 2 away from the display region 99.

At least a portion of the plurality of pins 72 is located on the same side as the plurality of pads 71 along the first direction 9991.

Each of the test data signal lines 8531 is electrically coupled to at least one of the plurality of pins 72.

Each of the test control signal lines 8532 is electrically coupled to at least one of the plurality of pins 72.

Referring to FIG. 4, the display substrate further includes the plurality of pins 72 disposed on the base substrate 9 and configured to obtain a signal. Exemplarily, the pins 72 may be one or more metal layers in a sheet shape disposed on the base substrate 9. For example, the pin 72 may contact a test probe during testing to obtain a signal from the test probe.

Each of the test data signal line 8531 and the test control signal line 8532 is electrically coupled to the pin 72, and the pin 72 at least provides a signal to the test unit 3.

The plurality of pins 72 may also be located on a side of the multiplexing units 2 away from the display region 99, and may be located on one or both sides of the pads 71 along the first direction 9991.

Referring to FIG. 4, in some embodiments, the plurality of pins 72 are respectively located on both sides of the plurality of pads 71 along the first direction 9991.

Referring to FIG. 4, the plurality of pads 71 may be distributed in an intensive manner to facilitate bonding the pads to the flexible circuit board or the driver chip, and the plurality of pins 72 are distributed on both sides of the pads 71 along the first direction 9991 so as to realize the uniform distribution of the pins 72.

In some embodiments, along the first direction 9991, other pads 712 except for the pads 711 corresponding to the multiplexing data signal lines 8521 are located in the middle, and the pads 711 corresponding to the multiplexing data signal lines 8521 are respectively located on both sides of the other pads 712.

As described above, since the display substrate has a large number of multiplexing data signal lines 8521 and a large number of pads 711 corresponding to the multiplexing data signal lines 8521, and the display substrate has a relatively small number of other pads 712 (i.e., the pads 712 corresponding to the test data signal line 8531, the test control signal line 8532, the multiplexing control signal line 8522, the positive signal source, the negative signal source, the clock signal source, and the like), considering the uniform layout and simple structure, the other pads 712 except for the pads 711 corresponding to the multiplexing data signal lines 8521 are centralized in the middle, the large number of pads 711 corresponding to the multiplexing data signal line 8521 are respectively arranged on both sides of the other pads 712 so as to realize the uniform distribution of lead lines.

Of course, due to the limitation of size, FIG. 4 shows only some of the multiplexing units 2, some of the multiplexing data signal lines 8521, and the corresponding pads 711, but the positions and numbers of the actual structures in the embodiment of the present disclosure are not limited thereto.

Referring to FIG. 4, in some embodiments, at least two of the plurality of multiplexing units 2 are electrically coupled to the same multiplexing data signal line 8521 via different sub-lines 85211.

Referring to FIG. 4, in the embodiment of the present disclosure, multiple multiplexing units 2 (e.g., two multiplexing units in the figure) may be electrically coupled to the same multiplexing data signal line 8521 via respective sub-lines 85211, so as to minimize the number of data signal lines.

Of course, in order to realize individual control of each data line 81, the multiplexing units 2 electrically coupled to the same multiplexing data signal line 8521 may be electrically coupled to different multiplexing control signal lines 8522.

Referring to FIG. 4, in some embodiments, the plurality of multiplexing control signal lines 8522 are located between the plurality of test data signal lines 8531 and the display region 99.

The plurality of multiplexing control signal lines 8522 are located between the plurality of test control signal lines 8532 and the display region 99.

Obviously, since the multiplexing control signal lines 8522 are electrically coupled to the multiplexing units 2 respectively, the multiplexing control signal line 8522 are closer to the display region 99 (an in turn closer to the multiplexing units 2) than the lead lines (i.e., the test data signal lines 8531 and the test control signal lines 8532) of the test units 3.

In an embodiment, when the test data signal lines 8531 and the test control signal lines 8532 are closed lines, the multiplexing control signal lines 8522 may be lead lines extending substantially along the first direction 9991 and disposed between the test data signal lines 8531/the test control signal lines 8532 and the multiplexing units 2.

Referring to FIG. 4, in some embodiments of the present disclosure, the display substrate further includes a plurality of first signal introduction lines 871 in the peripheral region.

The plurality of first signal introduction lines 871 are electrically coupled to at least a portion of the plurality of pads 71, at least one of the plurality of multiplexing control signal lines 8522, at least one of the plurality of test data signal lines 8531, and at least one of the plurality of test control signal lines 8532.

Referring to FIG. 4, as described above, the pads 71 are located on a side of the multiplexing units 2 away from the display region 99, that is, the pads 71 are separated from the multiplexing units 2 and the test units 3 by a certain distance. Therefore, the first signal introduction lines 871 may be provided to electrically couple the pads 71 with the multiplexing control signal lines 8522, the test data signal lines 8531, and the test control signal lines 8532. For example, each of the first signal introducing lines 871 may couple (physically couple, and further electrically couple since obviously the first signal introducing line 871 is conductive) the pad 71 and the multiplexing control signal line 8522 (i.e., the line between the display region 99 and the test data signal line 8531/the test control signal line 8532 as above), or may couple the pad 71 and the test data signal line 8531 (i.e., the above closed line), or may couple the pad 71 and the test control signal line 8532 (i.e., the above closed line), therefore the electrically connection between the multiplexing control signal line 8522, the test data signal line 8531, the test control signal line 8532 and the pad 71 can be realize by using the first signal introducing line 871, and the control of the multiplexing unit 2 and the test unit 3 using the pad 71 can be realize.

In some embodiments, the base substrate 9 is made of a flexible material.

In an embodiment of the present disclosure, the base substrate 9 is made of a flexible material (e.g., polyimide or the like) and has a bendable structure.

Thus, in the product of the display device, the region where the above pads 71 and pins 72 are located can be bent to the "the back surface" of the display region 99 by bending the base substrate 9, so as to further narrow the width of the bezel of the display device.

In order to avoid damaging to complex structures such as the multiplexing units 2, the above bent region may be located between the region where the multiplexing units 2 are located and the region where the pads 71 and the pins 72 are located, for example, the bent region is a region where the above first signal introducing lines 871 are located.

Referring to FIG. 4, in some embodiments of the present disclosure, the display substrate further includes a plurality of second signal introduction lines 872.

The plurality of second signal introduction lines 872 are electrically coupled to at least one of the plurality of pins 72 and at least one of the plurality of first signal introduction lines 871.

Referring to FIG. 4, the pins 72 (i.e., the pins 72 are on both sides of the pads 71 along the first direction 9991) may be electrically coupled to the first signal introducing lines 871 via the second signal introducing lines 872. For example, each of the second signal introducing lines 872 may couple (physically, and further electrically couple since the second signal introducing line 872 is conductive) the pin 72 and the first signal introducing line 871, therefore the signal from the pin 72 may be input to the first signal introducing line 871, and then input to the multiplexing control signal line 8522, the test data signal line 8531, the test control signal line 8532, etc. via the first signal introducing line 871, so as to control the multiplexing unit 2 and the test unit 3, etc. by using the pin 72.

With the above structure, signals from the pins 72 and the pads 71 are introduced into the first signal introducing lines 871 finally, thereby decreasing the number and the total length of lead lines, reducing the layout area, simplifying the product structure, and narrowing the bezel of the display device.

Of course, it should be understood that when the display substrate includes the gate driver circuit 4 and the control driving circuit 5, corresponding lead lines, pads 71, pins 72, etc. for providing signals for the circuits may be provided, and will not be described in detail herein.

In the drawing, due to space limitations, each of the gate driver circuit 4 and the control driving circuit 5 corresponds to only one pad 71 (or pin 72). However, it should be understood that the actual number of pads 71 (or pins 72) corresponding to the gate driver circuit 4 and the control driving circuit 5 is not limited thereto.

Of course, it should be understood that other structures of the sub-pixel 1 (such as the positive terminal VDD, the negative terminal VSS, etc.) may be provided with corresponding leads, pads 71, pins 72, etc. for providing signals thereto, and will not be described in detail herein.

Figure 5:
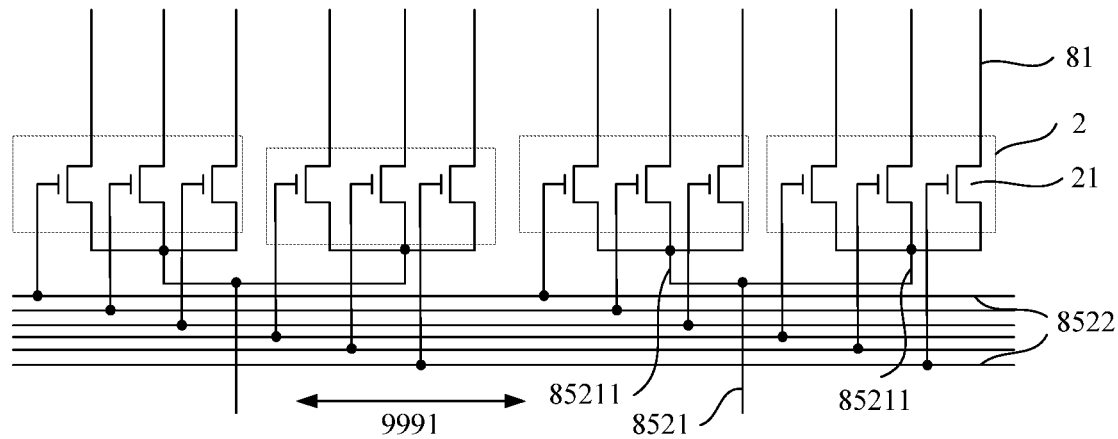
FIG. 5 is a schematic diagram showing a circuit structure of a multiplexing unit in a display substrate according to an embodiment of the present disclosure.
Figure 6:
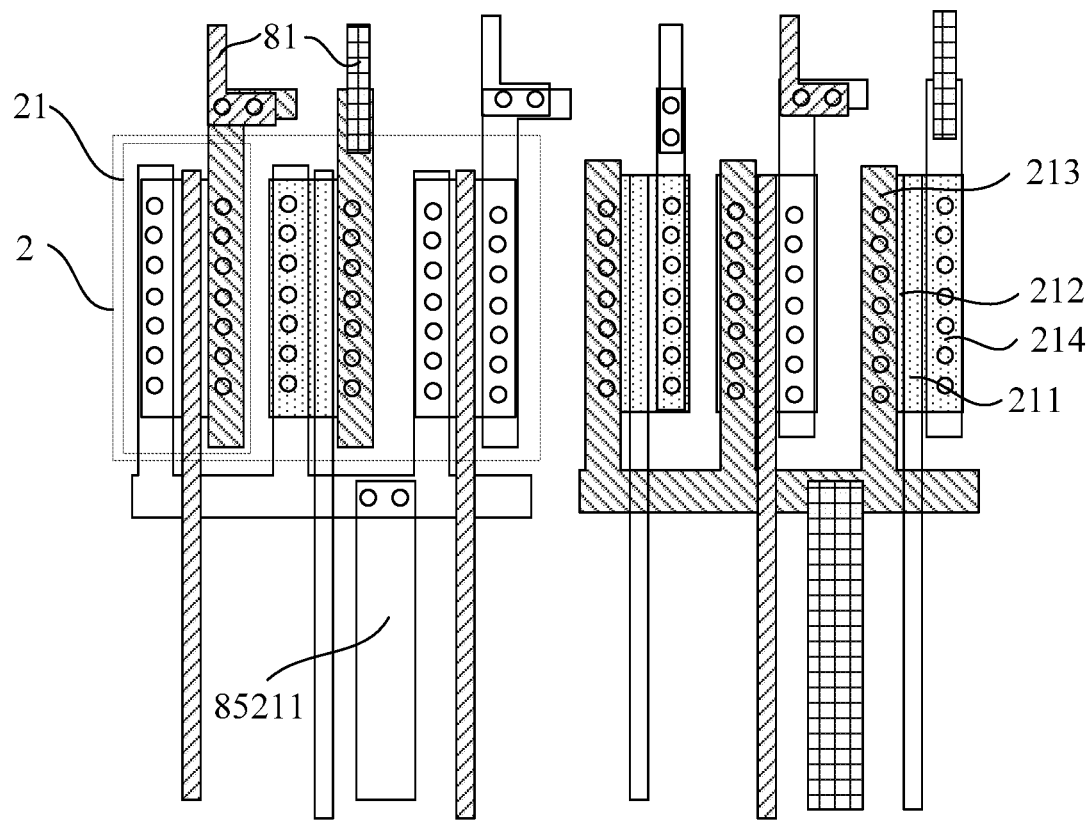
FIG. 6 is a schematic diagram showing a structure of a multiplexing unit in a display substrate according to an embodiment of the present disclosure.

Referring to FIGS. 5, 6, in some embodiments, at least one of the plurality of multiplexing units 2 includes m multiplexing transistors 21.

Among the m multiplexing transistors 21 of the at least one of the plurality of multiplexing units 2, a gate electrode 211 of each of them multiplexing transistors 21 is electrically coupled to a respective one of the plurality of multiplexing control signal lines 8522, a first electrode 213 of each multiplexing transistor 21 is electrically coupled to a respective one of the plurality of data lines 81, and second electrodes 214 of the m multiplexing transistors 21 are electrically coupled to a same one of the plurality of multiplexing data signal lines 8521.

Referring to FIGS. 5 and 6, each of the multiplexing units 2 may include m multiplexing transistors 21 (m is at least 2). The gate electrodes 211 of the m multiplexing transistors 21 are electrically coupled to different multiplexing control signal lines 8522 respectively, the first electrodes 213 (i.e., drain electrodes) of the m multiplexing transistors 21 are electrically coupled to different data lines 81 respectively, and the second electrodes 214 (i.e., source electrodes) of the m multiplexing transistors 21 are electrically coupled to the same multiplexing data signal line 8521 (e.g., via the sub-line 85211).

It can be seen that, during display, when a turn-on signal is supplied to any one of the gate lines 82, a turn-on signal may be supplied to the control signal lines in a time-division manner to turn on the multiplexing transistors 21 of each multiplexing unit 2 in a time-division manner. When any one of the multiplexing transistors 21 is turned on, a data signal on the data line 81 electrically coupled to that multiplexing transistor 21 is supplied via the multiplexing data signal line 8521 and written into the corresponding sub-pixel 1.

In an embodiment, referring to FIG. 5, m equals 3, that is, each multiplexing unit 2 may control three data lines 81 (one multiplexing unit for three data lines).

Obviously, according to the above embodiment, the number of data lines 81 may equal to m×the number of multiplexing units 2; while the number of multiplexing control signal lines 8522 is greater than or equal to m. For example, referring to FIGS. 4 and 5, when every two multiplexing units 2 are electrically coupled to one multiplexing data signal line 8521, the number of multiplexing control signal lines 8522 may be 2 m (e.g., six multiplexing control signal lines).

In some embodiments, referring to FIGS. 4 and 6, the plurality of multiplexing units 2 are arranged in a row along the first direction 9991.

The m multiplexing transistors 21 of the at least one of the plurality of multiplexing units 2 are arranged in a row along the first direction 9991, and the first electrode 213 and the second electrode 214 of each of the multiplexing transistors 21 are respectively located on both sides of an active layer 212 of the multiplexing transistor 21 along the first direction 9991.

Referring to FIGS. 4 and 6, in an embodiment of the present disclosure, the plurality of multiplexing units 2 may be arranged in a row in the first direction 9991 in the first edge region 91. The m multiplexing transistors 21 of each of the multiplexing units 2 are also arranged in a row along the first direction 9991. Furthermore, the first electrode 213 and the second electrode 214 of each of the multiplexing transistors 21 are also respectively located on both sides of the active layer 212 of the multiplexing transistor 21 along the first direction 9991.

As described above, the data lines 81 extend along the second direction 9992, i.e., the data lines 81 are sequentially arranged along the first direction 9991, therefore the multiplexing units 2 and the transistors thereof are arranged along the first direction 9991, which is favorable for coupling of the transistors to the corresponding data lines 81, making the structure regular and convenient for layout design.

Various distributions of the structures of the multiplexing unit 2 in layers may be realized.

Figure 7:
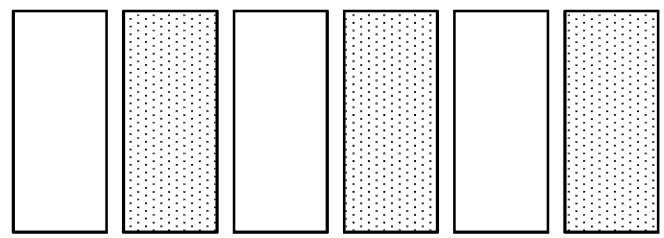
FIG. 7 is a schematic diagram showing a structure of a layer where an active layer of a multiplexing transistor in FIG. 6 is located.
Figure 8:
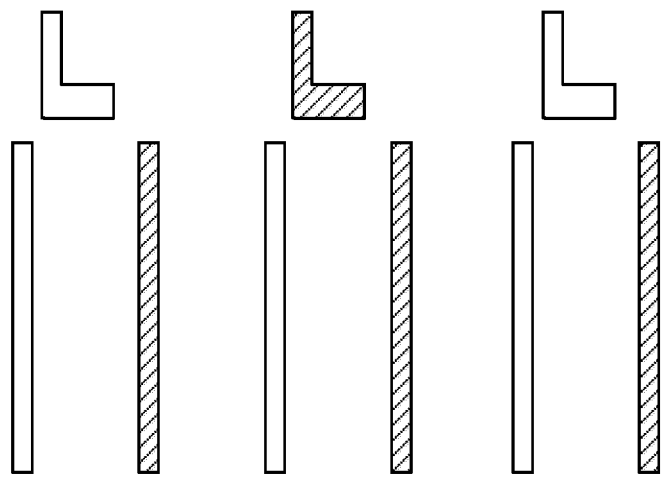
FIG. 8 is a schematic diagram showing a structure of a layer where a gate electrode of the multiplexing transistor in FIG. 6 is located.
Figure 9:
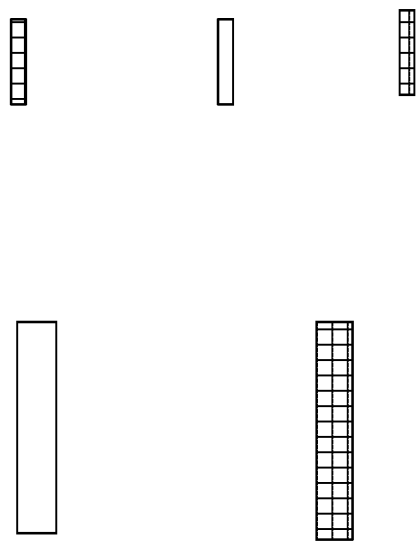
FIG. 9 is a schematic diagram showing a structure of another conductive layer in FIG. 6.
Figure 10:
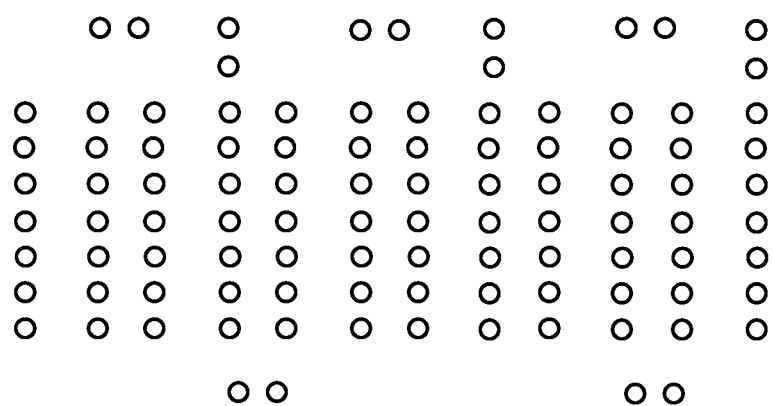
FIG. 10 is a schematic diagram showing of positions of via holes in an insulation layer in FIG. 6.
Figure 11:
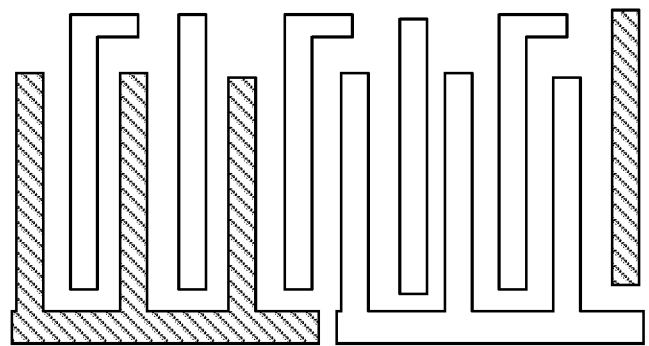
FIG. 11 is a schematic diagram showing a structure of a layer where first and second electrodes of the multiplexing transistor in FIG. 6 are located.

For example, referring to FIGS. 3, 6 to 11, the active layers 212 (as shown in FIG. 7) of the multiplexing transistors 21 may be disposed in the same layer as the first active layer 111, spaced apart from the first active layer 111 along the first direction 9991, and covered by the gate insulation layer 190. The gate electrodes 211 (as shown in FIG. 8) of the multiplexing transistors 21 may be disposed in the same layer as the first gate electrode 112, and meanwhile in the same layer a structure for electrically coupling the first electrodes of a portion of the multiplexing transistors 21 to the corresponding data lines 81 (or a portion of the data lines 81) is disposed therein. Above sub-lines 85211 (as shown in FIG. 9) and a structure for electrically coupling the first electrodes 213 of the other portion of the multiplexing transistors 21 to the corresponding data lines 81 (or a portion of the data lines 81) are disposed in the same layer as the second plate 122. The first electrodes 213 and the second electrodes 214 (as shown in FIG. 11) of the multiplexing transistors 21 may be disposed in the same layer as the first source electrode 113 and the first drain electrode 114, and the second electrodes 214 of the multiplexing transistors 21 of the same multiplexing unit 2 are connected together at one ends of the second electrodes 214 and formed as one-piece structure. The electrical connection to corresponding structures may be realized by the via holes in the second insulation layer 192 (as shown in FIG. 10).

Figure 12:
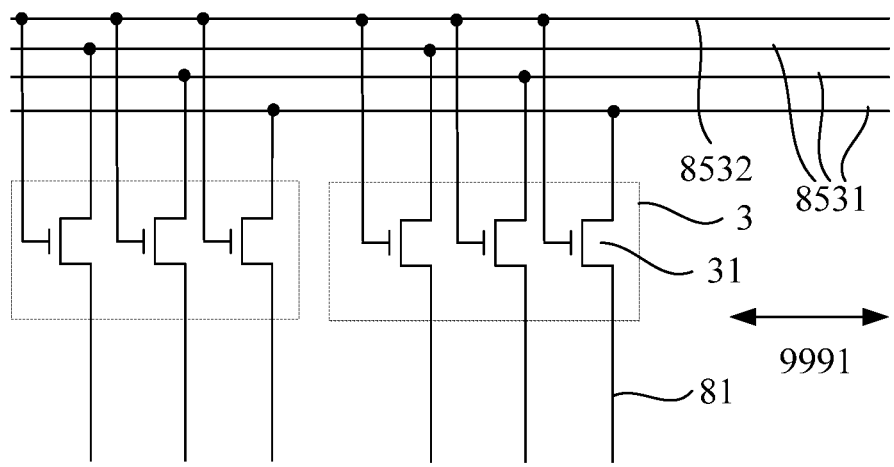
FIG. 12 is a schematic diagram showing a circuit structure of a test unit in a display substrate according to an embodiment of the present disclosure.
Figure 13:
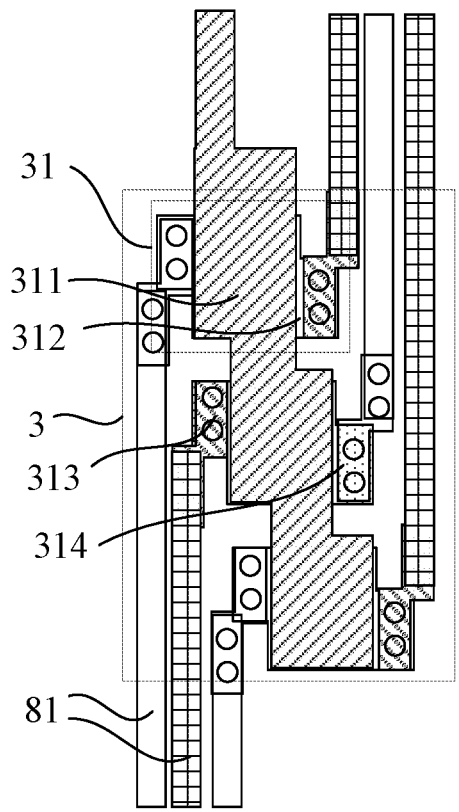
FIG. 13 is a schematic diagram showing a structure of a test unit in a display substrate according to an embodiment of the present disclosure.

Referring to FIGS. 12 and 13, in some embodiments, the total number of the at least one test data signal line 8531 is n, n being an integer greater than or equal to 2, and the total number of the at least one test control signal line 8532 is one.

At least one of the plurality of test units 3 includes n test transistors 31.

Among the n test transistors 31 of the same test unit 3, the gate electrodes 311 of the n test transistors 31 are electrically coupled to the one test control signal line 8532, a first electrode 313 of each of the test transistors 31 is electrically coupled to a respective one of the data lines 81, and a second electrode 314 of each of the test transistors 31 is electrically coupled to a respective one of the n test data signal lines 8531.

Referring to FIG. 12, in an embodiment of the present disclosure, the number of test data signal lines 8531 is n (n is greater than or equal to 2), and the number of test control signal lines 8532 is only one. Each of the test units 3 also includes n test transistors 31. The gate electrodes 311 of the n test transistors 31 are electrically coupled to the only one test control signal line 8532, the first electrodes 313 (i.e., the drain electrodes) are electrically coupled to different data lines 81 respectively, and the second electrodes 314 (i.e., the source electrodes) of the n test transistors 31 are electrically coupled to the n test data signal lines 8531 respectively (i.e., the second electrodes of different test transistors 31 are electrically coupled to corresponding data signal lines 8531 respectively).

It can be seen that whether the test transistors 31 of each test unit 3 are turned on or off can be controlled via the test control signal line 8532, and the signal from each test data signal line 8531 may be controlled to be written into different data lines 81 so as to control whether to perform a test or not. When a test is performed, a turn-on signal may be supplied to the test control signal line 8532, and signals required for the test may be supplied to the n test data signal lines 8531 respectively, so that the data lines 81 may obtain the signals required for the test.

Therefore, in some embodiments, the number of data lines 81 may equal to n×the number of test units 3.

In some embodiments, n equals 3.

In some embodiments, the sub-pixels 1 electrically coupled to the same data line 81 may have the same color. For example, the sub-pixels 1 in the same column have the same color. For example, the sub-pixels 1 in red, green and blue in a row are arranged along the first direction 9991.

Therefore, when a test is performed, the same signal may be provided to a data line 81 corresponding to the sub-pixels 1 in the same color, so that the sub-pixels 1 may perform the same display (i.e., whether a sub-pixel emits light or not), so as to determine whether the sub-pixel 1 is a defective sub-pixel or not according to the color of the displayed image, and locate the defective sub-pixel.

Referring to FIGS. 4 and 13, in some embodiments, the plurality of test units 3 are arranged in a row along the first direction 9991.

The n test transistors 31 of the at least one of the plurality of test units 3 are arranged in a row along a direction inclined with respect to both of the first direction 9991 and the second direction 9992. The gate electrodes 311 of the n test transistors 31 are connected together and formed as a one-piece structure in a stair shape, and the first electrode 313 and the second electrode 314 of each of the test transistors 31 are respectively located on both sides of the active layer 312 of the test transistor 31 along the first direction 9991.

Referring to FIGS. 4 and 13, in an embodiment of the present disclosure, the test units 3 may be arranged in a row in the second edge region 92 along the first direction 9991. A direction (e.g., a direction inclined from the upper left to the lower right in FIG. 13) along which the n test transistors 31 of the same test unit 3 are arranged is inclined with respect to both of the first direction 9991 and the second direction 9992. Therefore, the gate electrodes 311 of the n test transistors 31 of the same test unit 3 are connected together and formed as one-piece structure having "a stair shape". Moreover, the first and second electrodes 313 and 314 of each test transistor 31 are located on both sides of the active layer 312 of the test transistor 31 along the first direction 9991, respectively.

It can be seen that, according to the above embodiment, the space occupied by the entire of each test unit 3 along the first direction 9991 is decreased, which is advantageous for the uniform distribution of the structure and the sufficient utilization of the space.

Various distributions of the structures of the test unit 3 in layers may be realized.

Figure 14:
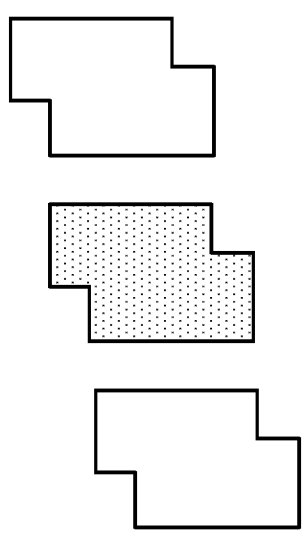
FIG. 14 is a schematic diagram showing a structure of a layer where an active layer of a test transistor in FIG. 13 is located.
Figure 15:
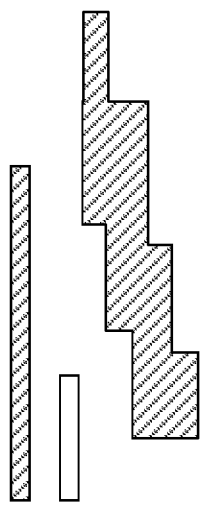
FIG. 15 is a schematic diagram showing a structure of a layer where a gate electrode of the test transistor in FIG. 13 is located.
Figure 16:
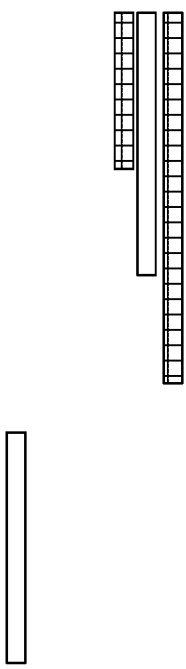
FIG. 16 is a schematic diagram showing another conductive layer in FIG. 13.
Figure 17:
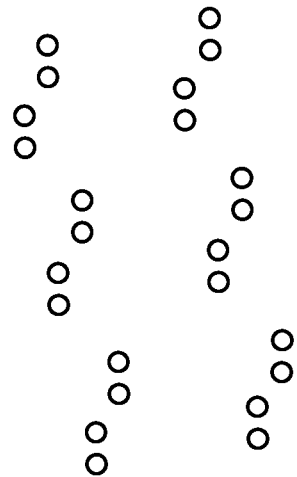
FIG. 17 is a schematic diagram showing positions of via holes in an insulation layer in FIG. 13.
Figure 18:
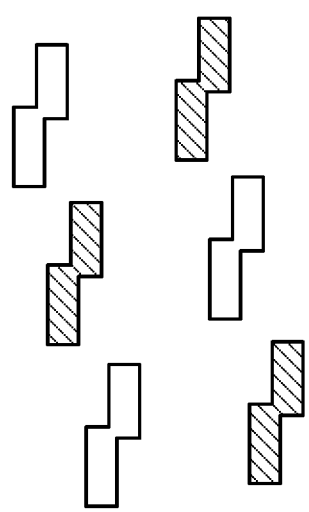
FIG. 18 is a schematic diagram showing a structure of a layer where first and second electrodes of the test transistor in FIG. 13 are located.

For example, referring to FIGS. 3, 13 to 18, the active layer 312 (as shown in FIG. 14) of the test transistors 31 are spaced apart from each other along a direction inclined with respect to both of the first direction 9991 and the second direction 9992, disposed in the same layer as the first active layer 111, and covered by the gate insulation layer 190. The gate electrodes 311 (as shown in FIG. 15) of the test transistors 31 may be disposed in the same layer as the first gate electrode 112, and meanwhile in the same layer a structure for electrically coupling the first electrodes of a portion of the test transistors 31 to corresponding data lines 81 (i.e., a portion of the data lines 81) is disposed therein. A structure (as shown in FIG. 16) for electrically coupling the first electrodes 313 of the other portion of the test transistors 31 to corresponding data lines 81 (i.e., a portion of the data lines 81) and a structure for electrically coupling the second electrodes of the test transistors 31 to corresponding test data signal lines 8531 are disposed in the same layer as the second electrode plate 122. The first electrode 313 and the second electrode 314 (as shown in FIG. 18) of the test transistor 31 may be disposed in the same layer as the first source electrode 113 and the first drain electrode 114. The electrical connection to corresponding structures may be realized by the via holes in the second insulation layer 192 (as shown in FIG. 17).

Of course, it should be understood that the specific implementations of the multiplexing unit 2 and the test unit 3, as well as the distribution of the structures in the layers are illustrated as an example, and the embodiments of the present disclosure are not limited thereto, and therefore other modifications will not be described in detail herein.

As a second aspect, an embodiment of the present disclosure provides a display device, including the display substrate according to anyone of the embodiments of the present disclosure.

In an embodiment of the present disclosure, the above display substrate may be combined with other devices (e.g., a counter substrate, a power supply, a flexible printed board, a driver chip, a housing, and the like) to form a display device having a display function.

In some embodiments, the display device is a wearable display device.

The display device in the embodiment of the present disclosure may be a display device which is worn on a human body in some way, such as a smart watch, a smart bracelet and the like.

When the base substrate is made of a flexible material, the display device may further be a flexible and deformable display device, such as a flexible wearable display device.

Of course, the display device according to the embodiment of the present disclosure may also be any other product or component having a display function, such as a liquid crystal display panel (LCD), an organic light-emitting diode (OLED) display panel, an electronic paper, a mobile phone, a tablet computer, a television, a display, a notebook computer, a digital photo frame, a navigator, and the like.

The present disclosure has disclosed example embodiments, and although specific terms are employed, the specific terms are used and should be interpreted in a generic and descriptive sense only and not for purposes of limitation. It is apparent for one skilled in the art that features, characteristics and/or elements described in connection with a certain embodiment may be used alone or in combination with features, characteristics and/or elements described in connection with other embodiments, unless expressly stated otherwise. Therefore, those skilled in the art will understand that various forms and details can be modified without departing from the scope of the present disclosure set forth by the appended claims.

What is claimed is:

1. A display substrate, comprising:
a base substrate having a display region and a peripheral region surrounding the display region;
a plurality of sub-pixels in the display region;
a plurality of data lines in the display region, electrically coupled to the plurality of sub-pixels respectively, and configured to provide a data signal to the plurality of sub-pixels respectively;
a plurality of pads in the peripheral region, wherein at least a portion of the plurality of pads are configured to provide a data signal to the plurality of data lines respectively;
at least one test data signal line in the peripheral region;
at least one test control signal line in the peripheral region; and
a plurality of test units in the peripheral region and on a side of the display region away from the plurality of pads, wherein
at least one of the plurality of test units is electrically coupled to the at least one test data signal line, the at least one test control signal line and at least one data line of the plurality of data lines respectively, and configured to transmit a signal provided by the at least one test data signal line to the at least one data line according to a signal provided by the at least one test control signal line,
a plurality of multiplexing units on a side of the display region away from the plurality of test units;
a plurality of multiplexing data signal lines configured to provide data signals to the plurality of multiplexing units, and
a plurality of multiplexing control signal lines configured to provide control signals to the plurality of multiplexing units, wherein
at least one of the plurality of multiplexing units comprises m multiplexing transistors, the m multiplexing transistors comprises gate electrodes electrically coupled to different multiplexing control signal lines of the plurality of multiplexing control signal lines, first electrodes electrically coupled to different data lines, and second electrodes electrically coupled to a same multiplexing data signal line of the plurality of multiplexing data signal lines.

2. The display substrate according to claim 1, wherein
the display region comprises: a first boundary and a second boundary extending substantially along a first direction; a third boundary and a fourth boundary extending substantially along a second direction, the first boundary and the second boundary being on opposite sides of the display region respectively, and the third boundary and the fourth boundary being on opposite sides of the display region respectively; a first arc angle connecting the first boundary and the third boundary; a second arc angle connecting the first boundary and the fourth boundary; a third arc angle connecting the second boundary and the third boundary; and a fourth arc angle connecting the second boundary and the fourth boundary,
the first direction and the second direction intersect each other;
the peripheral region comprises a first edge region outside the first boundary, a second edge region outside the second boundary, a third edge region outside the third boundary, a fourth edge region outside the fourth boundary, a first corner region connecting the first edge region and the third edge region, a second corner region connecting the first edge region and the fourth edge region, a third corner region connecting the second edge region and the third edge region, and a fourth corner region connecting the second edge region and the fourth edge region.

3. The display substrate according to claim 2, wherein
the first boundary and the second boundary are parallel to the first direction, and
the third boundary and the fourth boundary are parallel to the second direction.

4. The display substrate according to claim 3, wherein
the first direction is perpendicular to the second direction, each of the first arc angle, the second arc angle, the third arc angle, and the fourth arc angle is a convex arc angle.

5. The display substrate according to claim 2, wherein
at least a portion of the plurality of test units is in the second edge region, or
all of the plurality of test units are in the second edge region.

6. The display substrate according to claim 2, wherein
at least a portion of the plurality of multiplexing units is in the first edge region, the plurality of pads are on a side of the at least a portion of the plurality of multiplexing units away from the display region.

7. The display substrate according to claim 6, wherein at least two of the plurality of multiplexing units are electrically coupled to a same multiplexing data signal line via different sub-lines.

8. The display substrate according to claim 6, wherein the plurality of multiplexing control signal lines are between the at least one test data signal line and the display region, and
the plurality of multiplexing control signal lines are between the at least one test control signal line and the display region.

9. The display substrate according to claim 6, wherein all of the plurality of multiplexing units are in the first edge region.

10. The display substrate according to claim 6, wherein each of the plurality of multiplexing data signal lines is electrically coupled to at least one of the plurality of pads, and
each of the plurality of multiplexing control signal lines is electrically coupled to at least one of the plurality of pads.

11. The display substrate according to claim 6, further comprising a plurality of pins in the peripheral region; wherein
the plurality of pins are on a side of the plurality of multiplexing units away from the display region,
at least a portion of the plurality of pins is on a side of the plurality of pads along the first direction,
each of the at least one test data signal line is electrically coupled to at least one of the plurality of pins, and
each of the at least one test control signal line is electrically coupled to at least one of the plurality of pins.

12. The display substrate according to claim 11, wherein the plurality of pins are respectively on two sides of the plurality of pads along the first direction.

13. The display substrate according to claim 12, further comprising a plurality of first signal introduction lines in the peripheral region; wherein
the plurality of first signal introduction lines are electrically coupled to at least a portion of the plurality of pads, at least one of the plurality of multiplexing control signal lines, the at least one test data signal line, and the at least one test control signal line, respectively.

14. The display substrate according to claim 13, further comprising a plurality of second signal introduction lines; wherein
the plurality of second signal introduction lines are electrically coupled to at least one of the plurality of pins and at least one of the plurality of first signal introduction lines, respectively.

15. The display substrate according to claim 1, wherein the plurality of multiplexing units are arranged in a row along the first direction,
the m multiplexing transistors of the at least one of the plurality of multiplexing units are arranged in a row along the first direction, and
a first electrode and a second electrode of each of the m multiplexing transistors are respectively on two sides of an active layer of the multiplexing transistor along the first direction.

16. The display substrate according to claim 1, wherein the at least one test data signal line is in the peripheral region and is a closed line surrounding the display region, and
the at least one test control signal line is in the peripheral region and is a closed line surrounding the display region.

17. The display substrate according to claim 1, wherein the at least one test data signal line comprises n test data signal lines with n being an integer greater than or equal to 2, and the at least one test control signal line comprises one test control signal line,
at least one of the plurality of test units comprises n test transistors,
among the n test transistors of a same test unit, gate electrodes of the n test transistors are electrically coupled to the one test control signal line, a first electrode of each of the n test transistors is electrically coupled to a respective one of the plurality of data lines, and a second electrode of each of the n test transistors is electrically coupled to a respective one of the n test data signal lines.

18. The display substrate according to claim 17, wherein the plurality of test units are arranged in a row along the first direction,
the n test transistors of the at least one of the plurality of test units are arranged in a row along a direction inclined with respect to both of the first direction and the second direction, the gate electrodes of the n test transistors are a one-piece structure in a stair shape, and a first electrode and a second electrode of each of the n test transistors are respectively on two sides of an active layer of the test transistor along the first direction.

19. A display device, comprising the display substrate according to claim 1.

* * * * *